United States Patent
Huang et al.

(10) Patent No.: US 11,690,253 B2
(45) Date of Patent: Jun. 27, 2023

(54) OLED DISPLAY PANEL, MANUFACTURING METHOD THEREOF AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Xing Huang, Beijing (CN); Xin Mou, Beijing (CN); Yuhsiung Feng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 187 days.

(21) Appl. No.: 17/207,765

(22) Filed: Mar. 22, 2021

(65) Prior Publication Data
US 2022/0069035 A1    Mar. 3, 2022

(30) Foreign Application Priority Data
Aug. 26, 2020    (CN) .......................... 202010872499.0

(51) Int. Cl.
*H10K 59/122*    (2023.01)
*H10K 50/844*    (2023.01)
(Continued)

(52) U.S. Cl.
CPC ......... *H10K 59/122* (2023.02); *H10K 50/844* (2023.02); *H10K 50/865* (2023.02); *H10K 71/00* (2023.02)

(58) Field of Classification Search
CPC . H01L 51/56; H01L 51/5253; H01L 51/5284; H01L 51/5262; H01L 51/5275; H01L 51/3244; H01L 27/3246
See application file for complete search history.

(56) References Cited

U.S. PATENT DOCUMENTS

2006/0245060 A1    11/2006  Goto
2010/0014313 A1*   1/2010   Tillin ................. G02B 27/0101
                                                            359/619
(Continued)

FOREIGN PATENT DOCUMENTS

CN        102073076 A       5/2011
CN        109524568 A       3/2019
WO   WO-2018166260 A1 *   9/2018   ........... G02F 1/1333

OTHER PUBLICATIONS

Office Action dated Mar. 16, 2022 for Chinese Patent Application No. 202010872499.0 and English Translation.

*Primary Examiner* — Shaun M Campbell
(74) *Attorney, Agent, or Firm* — Ling Wu; Stephen Yang; Ling and Yang Intellectual Property

(57) ABSTRACT

An OLED display panel, a manufacturing method thereof and a display apparatus are provided. The display panel includes a substrate, a light emitting structure layer and a viewing angle improving layer which are arranged on the substrate. The light emitting structure layer is configured to emit light to the viewing angle improving layer. The viewing angle improving layer is disposed on one side of the light emitting structure layer away from the substrate and is configured to adjust the viewing angle of the display panel to allow the viewing angle of the display panel along a first direction to satisfy a first viewing angle range, and allow the viewing angle along a second direction to satisfy a second viewing angle range. The first direction is perpendicular to the second direction.

16 Claims, 10 Drawing Sheets

(51) Int. Cl.
*H10K 50/86* (2023.01)
*H10K 71/00* (2023.01)

(56) References Cited

U.S. PATENT DOCUMENTS

| | | | |
|---|---|---|---|
| 2011/0175118 A1* | 7/2011 | Hori | H10K 50/865 |
| | | | 430/7 |
| 2015/0123085 A1* | 5/2015 | Kim | H01L 51/5281 |
| | | | 257/40 |
| 2016/0011411 A1* | 1/2016 | Wang | G02B 26/02 |
| | | | 359/227 |
| 2016/0087245 A1 | 3/2016 | Park et al. | |
| 2018/0156955 A1* | 6/2018 | Diao | G02B 5/3041 |
| 2018/0342704 A1* | 11/2018 | Gwon | H10K 50/868 |
| 2020/0185652 A1 | 6/2020 | Sun | |
| 2021/0036263 A1* | 2/2021 | Kim | H01L 51/5237 |
| 2021/0200019 A1* | 7/2021 | Liang | G02F 1/133562 |
| 2022/0004017 A1* | 1/2022 | Choi | G02B 27/4233 |

* cited by examiner

OLED DISPLAY PANEL, MANUFACTURING METHOD THEREOF AND DISPLAY APPARATUS

CROSS-REFERENCE TO RELATED APPLICATION

The present application claims the priority of Chinese Patent Application No. 202010872499.0 filed to the CNIPA on Aug. 26, 2020, the content of which is incorporated herein by reference.

TECHNICAL FIELD

Embodiments of the present disclosure relate to but are not limited to the field of display technologies, in particular to a display panel, a manufacturing method thereof and a vehicle mounted display.

BACKGROUND

An Organic Light-Emitting Device (OLED for short) display panel has advantages of active light emission, ideal temperature characteristics, low power consumption, fast response, flexibility, ultra-thinness and low cost and is widely used in the field of display.

An OLED display panel may be applied to a vehicle mounted display, allowing both the driver and passengers in a vehicle to see the displayed images to know the vehicle conditions and road conditions.

SUMMARY

The following is a summary of the subject matter described in detail in the present disclosure. This summary is not intended to limit the protection scope of the claims.

In a first aspect, an embodiment of the present disclosure provides an OLED display panel which includes a substrate and a light emitting structure layer and a viewing angle improving layer which are disposed on the substrate.

The light emitting structure layer is configured to emit light to the viewing angle improving layer.

The viewing angle improving layer is disposed on one side of the light emitting structure layer away from the substrate, and is configured to adjust a viewing angle of the display panel to allow a viewing angle of the display panel along a first direction to satisfy a first viewing angle range and to allow a viewing angle along a second direction to satisfy a second viewing angle range. The first viewing angle range is smaller than the second viewing angle range; wherein the first direction is perpendicular to the second direction.

In some possible implementations, the viewing angle improving layer includes a first viewing angle improving layer and a second viewing angle improving layer; wherein the first viewing angle improving layer is disposed on one side of the second viewing angle improving layer close to the substrate. Alternatively, the first viewing angle improving layer is disposed on one side of the second viewing angle improving layer away from the substrate; the first viewing angle improving layer is configured to adjust the viewing angle of the display panel along the first direction which enables the viewing angle of the display panel along the first direction to meet the first viewing angle range; and the second viewing angle improving layer is configured to adjust the viewing angle of the display panel along a second direction which enables the viewing angle of the display panel along the second direction to meet the second viewing angle range.

In some possible implementations, the light emitting structure layer includes a pixel define layer, a plurality of light emitting layers and an encapsulation layer. Each light emitting layer includes a first electrode, an organic light emitting layer and a second electrode, wherein the first electrode is disposed on one side of the organic light emitting layer close to the substrate and the second electrode is disposed on one side of the organic light emitting layer away from the substrate; the pixel define layer is provided with a plurality of opening regions, each of the opening regions forms an effective light emitting region corresponding to the light emitting structure, and second electrodes of adjacent light emitting structures are electrically connected with each other; the encapsulation layer is disposed on one side of the second electrodes away from the substrate.

In some possible implementations, the first viewing angle improving layer includes an absorption layer and a light transmission layer which are arranged on a same layer; wherein the absorption layer is configured to absorb light rays with an incident angle larger than a threshold angle; the light transmission layer is configured to transmit light rays with an incident angle smaller than or equal to a threshold angle; an orthographic projection of a non-opening region of the pixel define layer on the substrate covers an orthographic projection of the absorption layer on the substrate, and a transmittance of the light transmission layer is greater than 90%.

In some possible implementations, in a direction perpendicular to the substrate, a height of the absorption layer is 70 microns to 150 microns and the height of a light transmission layer is greater than or equal to the height of the absorption layer; the absorption layer is made of black ink; and the light transmission layer is made of polyethylene terephthalate or cyclic olefin polymer.

In some possible implementations, the absorption layer comprises a plurality of absorption structures arranged along the first direction and each absorption structure has a strip structure with a size in the second direction being larger than a size in the first direction; wherein a cross section of each absorption structure extending along the first direction and perpendicular to a plane of the substrate is a parallelogram, and an included angle θ between a side parallel to and closer to the substrate and an adjacent side thereof of the parallelogram satisfies the following formula:

$$\tan|A| = \frac{H}{W + H/\tan\theta}$$

$$\tan|B| = \frac{H}{W - H/\tan\theta}$$

in the formula, a range from A to B is the first viewing angle range; H is a height of the absorption structure; and W is a width of an opening region along the second direction.

In some possible implementations, in a case that the height of the light transmission layer is greater than the height of the absorption layer, the light transmission layer has a planar structure and an orthographic projection of the light transmission layer on the substrate covers the orthographic projection of the absorption layer on the substrate.

In some possible implementations, in a case that the height of the light transmission layer is equal to the height of the absorption layer, the light transmission layer includes a plurality of transmission structures arranged along the first direction, and a size of each of the transmission structures in the second direction is larger than a size in the first direction; wherein orthographic projections of the transmission structures on the substrate are overlapped with orthographic projections of the plurality of opening regions on the substrate, and the transmission structures are configured to transmit light emitted by the corresponding light emitting structure; and the plurality of transmission structures and the plurality of absorption structures are arranged alternately and the transmission structures are contiguous to the absorption structures on both sides.

In some possible implementations, the second viewing angle improving layer includes a diffusion layer and a planarization layer, and the planarization layer is disposed on one side of the diffusion layer away from the substrate; wherein the diffusion layer is configured to diffuse light emitted from the light emitting structure layer, and a refractive index of the diffusion layer is larger than a refractive index of the planarization layer; and an orthographic projection of the planarization layer on the substrate covers an orthographic projection of the diffusion layer on the substrate, and a transmittance of the planarization layer is larger than 90%.

In some possible implementations, the diffusion layer comprises a plurality of diffusion structures arranged along the second direction and each diffusion structure has a strip structure extending along the first direction; an orthographic projection of the diffusion structure on the substrate covers an orthographic projection of the organic light emitting layer included in the corresponding light emitting structure on the substrate; a cross section of the diffusion structure extending along the second direction and perpendicular to a plane of the substrate is an isosceles trapezoid and an included angle between a leg and a bottom base of the isosceles trapezoid is greater than or equal to 20 degrees and less than or equal to 50 degrees.

In some possible implementations, the diffusion layer is made of a transparent organic material doped with nitrogen atoms or phosphorus atoms, a refractive index of the diffusion layer is 1.6 to 1.7, and a height of the diffusion layer is 50 microns to 100 microns; and the planarization layer is made of a transparent organic material, a refractive index of the planarization layer is 1.5 to 1.6 and a height of the planarization layer is greater than the height of the diffusion layer; wherein the transparent organic material comprise at least one of: acrylic resin, unsaturated polyester, polyurethane and epoxy resin.

In some possible implementations, the display panel further includes a protection layer; wherein the protection layer is disposed on one side of the viewing angle improving layer away from the substrate, a material of the protection layer comprises at least one of: polyethylene terephthalate and glass.

In some possible implementations, the first viewing angle range is an asymmetric viewing angle range while the second viewing angle range is a symmetric viewing angle range.

In a second aspect, an embodiment of the present disclosure further provides a display apparatus including the display panel described above which is arranged in a vehicle.

In a third aspect, an embodiment of the present disclosure further provides a method for manufacturing a display panel, which is configured to manufacturing the above display panel. The method includes: forming a light emitting structure layer on a substrate, wherein the light emitting structure layer is configured to emit light to a viewing angle improving layer; forming the viewing angle improving layer on the light emitting structure layer, wherein the viewing angle improving layer is configured to adjust a viewing angle of the display panel to allow a viewing angle of the display panel along a first direction to satisfy a first viewing angle range and allow a viewing angle along a second direction to satisfy a second viewing angle range, the first viewing angle range being smaller than the second viewing angle range; wherein the first direction is perpendicular to the second direction.

In some possible implementations, the viewing angle improving layer includes a first viewing angle improving layer and a second viewing angle improving layer; forming the viewing angle improving layer on the light emitting structure layer includes: forming the first viewing angle improving layer on the light emitting structure layer; and forming the second viewing angle improving layer on the first viewing angle improving layer, or includes forming the second viewing angle improving layer on the light emitting structure layer; and forming the first viewing angle improving layer on the second viewing angle improving layer.

In some possible implementations, forming the first viewing angle improving layer on the light emitting structure layer includes forming an absorption layer on the light emitting structure layer by a patterning process and forming a light transmission layer on the absorption layer by a patterning process; and forming the second viewing angle improving layer on the first viewing angle improving layer includes forming a diffusion layer on the first viewing angle improving layer by a printing process or a patterning process and forming a planarization layer on the diffusion layer by a patterning process.

In some possible implementations, forming the second viewing angle improving layer on the light emitting structure layer includes forming a diffusion layer on the light emitting structure layer by a printing process or a patterning process and forming a planarization layer on the diffusion layer by a patterning process; and forming the first viewing angle improving layer on the second viewing angle improving layer includes forming an absorption layer on the second viewing angle improving layer by a patterning process and forming a light transmission layer on the absorption layer by a patterning process.

In some possible implementations, the method further includes: forming a protection layer on the viewing angle improving layer.

Other aspects will become apparent when accompanying drawings and the detailed description is read and understood.

BRIEF DESCRIPTION OF DRAWINGS

Accompanying drawings are used to provide an understanding of technical solutions of the present disclosure and form a part of the specification. Together with embodiments of the present disclosure, they are used to explain technical solutions of the present disclosure and do not constitute a limitation on the technical solutions of the present disclosure.

DETAILED DESCRIPTION

Figure 1:
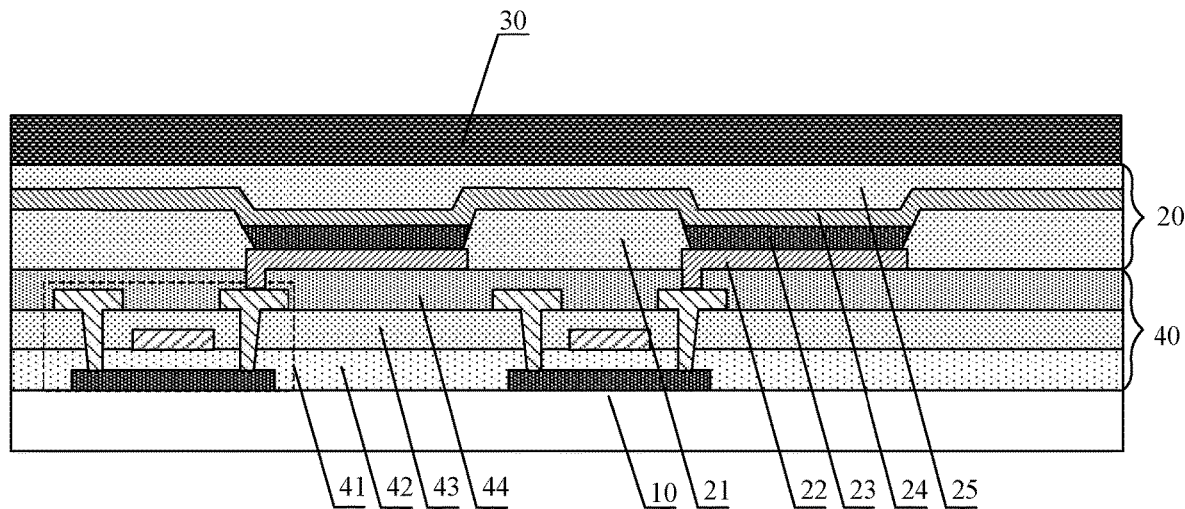
FIG. 1 is a schematic diagram of a structure of a display panel according to an embodiment of the present disclosure.

Hereinafter, embodiments of the present disclosure will be described in detail with reference to the accompanying drawings. Embodiments and features in the embodiments in the present disclosure may be combined with each other randomly if there is no conflict.

A plurality of embodiments are described in the present disclosure, but the description is exemplary rather than limiting, and for those of ordinary skills in the art, there may be more embodiments and implementation solutions within the scope of the embodiments described in the present disclosure. Although many possible combinations of features are shown in the drawings and discussed in the Detailed Description, many other combinations of the disclosed features are also possible. Unless specifically limited, any feature or element of any embodiment may be implemented in combination with or in place of any feature or element of any other embodiment.

The present disclosure includes and contemplates combinations of features and elements known to those of ordinary skilled in the art. The disclosed embodiments, features and elements of the present disclosure may be combined with any regular features or elements to form a technical solution defined by the claims. Any feature or element of any embodiment may also be combined with features or elements from other technical solutions to form another technical solution defined by the claims. Any of the features shown and/or discussed in the present disclosure may be implemented individually or in any suitable combination. The embodiments are not limited in any way except in accordance with the appended claims and equivalents thereof. Various modifications and changes can be made within the protection scope of the appended claims.

Unless otherwise defined, technical terms or scientific terms used in the present disclosure shall have general meanings as construed by those of ordinary skills in the art to which the present disclosure relates. The words "first", "second" and the like used in the present disclosure do not indicate any order, quantity or importance, but are only used to distinguish different components. Similar words such as "including" or "comprising" mean that elements or articles preceding the words cover elements or articles listed after the words and their equivalents, and do not exclude other elements or articles. Similar words such as "connect" and "link" are not limited to physical or mechanical connections and may include electrical connections, direct or indirect. "On", "below", "left", "right", etc. are only used to represent a relative position relationship that may change accordingly when an absolute position of an object being described changes.

In some technologies, OLED display panels used in vehicles adopt a top emission structure, and the viewing angle ranges in horizontal and vertical directions are the same, which cannot meet requirements on viewing angles of vehicle-mounted OLED display panels in horizontal and vertical directions.

FIG. 1 is a schematic diagram of a structure of a display panel according to an embodiment of the present disclosure. As shown in FIG. 1, the display panel according to the embodiment of the present disclosure includes a substrate 10 and a light emitting structure layer 20 and a viewing angle improving layer 30 which are disposed on the substrate 10.

The light emitting structure layer 20 is configured to emit light to the viewing angle improving layer 30. The viewing angle improving layer 30 is disposed on one side of the light emitting structure layer 20 away from the substrate 10 and is configured to adjust a viewing angle of the display panel to allow a viewing angle of the display panel along a first direction to satisfy a first viewing angle range and to allow a viewing angle along a second direction to satisfy a second viewing angle range. The first viewing angle range is smaller than the second viewing angle range.

The first direction is perpendicular to the second direction, which means that an included angle between the first direction and the second direction is about 90 degrees.

In an exemplary embodiment, the first direction includes two opposite directions on a same straight line.

In an exemplary embodiment, a plane where the first direction and the second direction lie is a plane where the display panel lies.

In an exemplary embodiment, the display panel may be an OLED display panel. The display panel may be disposed in a vehicle and is configured to display vehicle information.

In an exemplary embodiment, the display structure may be a top emitting structure.

In an exemplary embodiment, the substrate 10 may be a rigid substrate or a flexible substrate, wherein material of the rigid substrate may be but not limited to one or more of glass and metal foil. In an exemplary embodiment, the material of the flexible substrate may be but is not limited to one or more of polyethylene terephthalate, ethylene terephthalate, polyether ether ketone, polystyrene, polycarbonate, polyarylate, polyarylester, polyimide, polyvinyl chloride, polyethylene, and textile fiber.

In an exemplary embodiment, the first viewing angle range may be an asymmetric viewing angle range. For example, the first viewing angle range may be from +20° to −10°. The viewing angle range is from A to B and when |A|≠|B|, the viewing angle range from A to B is an asymmetric viewing angle range.

In an exemplary embodiment, the second viewing angle range may be a symmetric viewing angle range. For example, the second viewing angle range may be from +40° to −40°. The viewing angle range is from A to B and when |A|=|B|, the viewing angle range from A to B is a symmetric viewing angle range.

In an exemplary embodiment, the display panel may further include a driving structure layer 40 disposed on one side of the light emitting structure layer 20 close to the substrate 10. The driving structure layer includes a plurality of transistors 41. The plurality of transistors form a pixel circuit for driving the light emitting structure layer.

In an exemplary embodiment, each of the transistors 41 includes an active layer, a gate electrode, a source electrode and a drain electrode. The transistor 41 may be in a top gate structure or may be in a bottom gate structure.

In an exemplary embodiment, the transistor may be a P-type transistor or an N-type transistor. The P-type transistor is turned on when the gate electrode is at a low level and is turned off when the gate electrode is at a high level while the N-type transistor is turned on when the gate electrode is at a high level and is turned off when the gate electrode is at a low level.

In an exemplary implementation, the active layer may be made of a semiconductor material, such as polysilicon (such as low-temperature polysilicon and high-temperature polysilicon), amorphous silicon or metal oxides. When the active layer is made of a metal oxide, the metal oxide may be an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc, etc. The active layer may be single-layered, double-layered or multi-layered.

In an exemplary embodiment, the gate electrode, the source electrode and the drain electrode may be made of metal materials, such as any one or more of argentum (Ag), copper (Cu), aluminum (Al) and molybdenum (Mo) or others, or alloy materials of the above metals, such as Aluminum neodymium (AlNd) alloy or Molybdenum Niobium (MoNb) alloy, which may have a single-layered structure or a multi-layered composite structure, such as Mo/Cu/Mo, etc.

In an exemplary embodiment, the driving structure layer 40 may further include a first insulating layer 42, a second insulating layer 43 and a third insulating layer 44.

In an exemplary embodiment, the first insulating layer and the second insulating layer may be made of any one or more of silicon oxide (SiOx), silicon nitride (SiNx) and silicon oxynitride (SiON), and may be single-layered, multi-layered or composite layered.

In an exemplary embodiment, the third insulating layer 44 may include a planarization layer.

In an exemplary embodiment, the planarization layer may be made of an organic material.

The display panel according to the embodiment of the disclosure includes the substrate and the light emitting structure layer and a viewing angle improving layer which are disposed on the substrate. The light emitting structure layer is configured to emit light to the viewing angle improving layer. The viewing angle improving layer is disposed on one side of the light emitting structure layer away from the substrate and is configured to adjust the viewing angle of the display panel to allow the viewing angle of the display panel along a first direction to satisfy the first viewing angle range, and to allow the viewing angle along a second direction to satisfy the second viewing angle range. The first viewing angle range is smaller than the second viewing angle range and the first direction is perpendicular to the second direction. The present disclosure provides the viewing angle improving layer on the light emitting structure layer to allow the viewing angle of the display panel to satisfy requirement on the viewing angle of the vehicle-mounted display panel.

Figure 2:
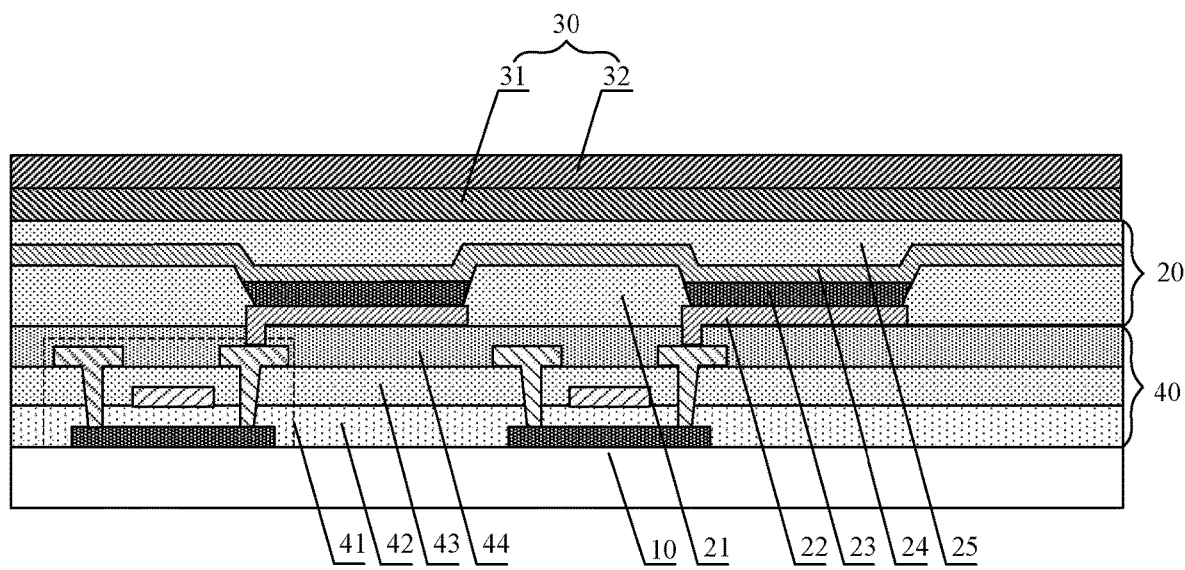
FIG. 2 is a schematic diagram of a structure of a display panel according to an exemplary embodiment.
Figure 3:
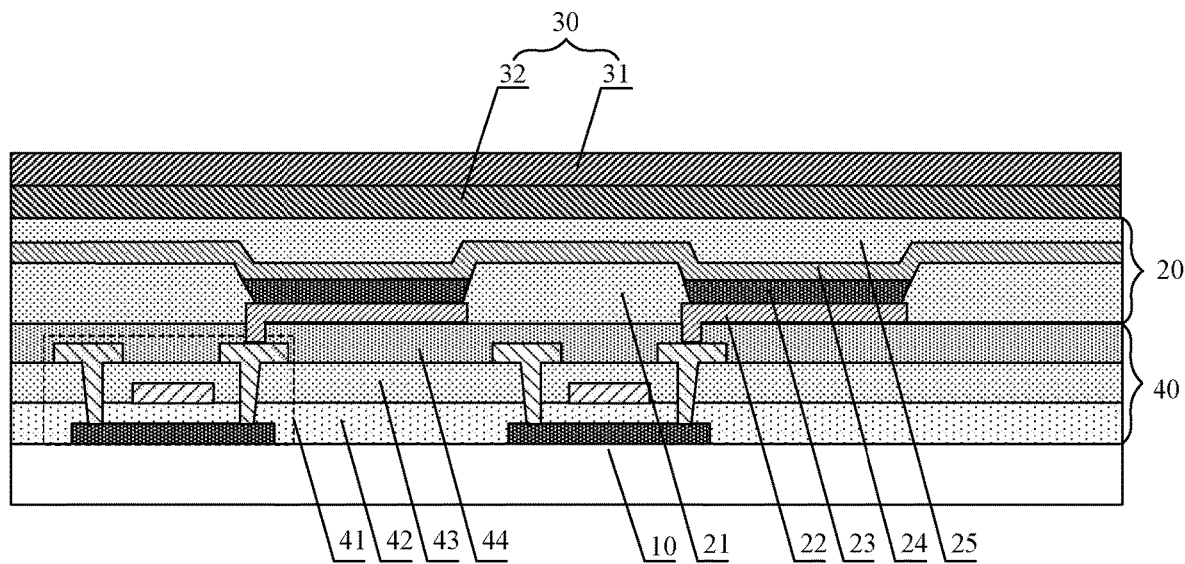
FIG. 3 is a schematic diagram of a structure of a display panel according to another exemplary embodiment.

FIG. 2 is a schematic diagram of a structure of a display panel according to an exemplary embodiment. FIG. 3 is a schematic diagram of a structure of a display panel according to another exemplary embodiment. As shown in FIGS. 2 and 3, in an exemplary embodiment, the viewing angle improving layer 30 includes a first viewing angle improving layer 31 and a second viewing angle improving layer 32.

In an exemplary embodiment, the first viewing angle improving layer 31 may be disposed on one side of the second viewing angle improving layer 32 close to the substrate 10; alternatively, the first viewing angle improving layer 31 may be disposed on one side of the second viewing angle improving layer 32 away from the substrate 10. FIG. 2 illustrates the viewing angle improving layer taking an example where the first viewing angle improving layer 31 is disposed on the side of the second viewing angle improving layer 32 close to the substrate 10. FIG. 3 illustrates the viewing angle improving layer taking an example where the first viewing angle improving layer 31 is disposed on the side of the second viewing angle improving layer 32 away from the substrate 10.

In an exemplary embodiment, the first viewing angle improving layer 31 is configured to adjust the viewing angle of the display panel along the first direction to allow the viewing angle of the display panel along the first direction to satisfy the first viewing angle range. The second viewing angle improving layer 32 is configured to adjust the viewing angle of the display panel along the second direction to allow the viewing angle of the display panel along the second direction to satisfy the second viewing angle range.

In an exemplary embodiment, as shown in FIG. 1, the light emitting structure layer 20 includes a pixel define layer 21, a plurality of light emitting structures and an encapsulation layer 25. Each light emitting structure includes a first electrode 22, an organic light emitting layer 23 and a second electrode 24.

The first electrode 22 is disposed on one side of the organic light emitting layer 23 close to the substrate 10 while the second electrode 24 is disposed on one side of the organic light emitting layer 23 away from the substrate 10.

The pixel define layer 21 is provided with a plurality of opening areas which correspond to the plurality of light emitting structures on a one-on-one basis. Second electrodes of adjacent light emitting structures are electrically connected with each other. The encapsulation layer 25 is disposed on one side of the second electrode 24 away from the substrate 10.

In an exemplary embodiment, a material of which the pixel define layer 21 is made may be polyimide, acrylic or polyethylene terephthalate.

In an exemplary embodiment, the first electrode 22 is a reflective electrode. The reflective electrode may be made of silver or aluminum.

In an exemplary embodiment, the second electrode 24 is a transmissive electrode. The transmissive electrode may be made of zinc tin oxide.

Figure 4:
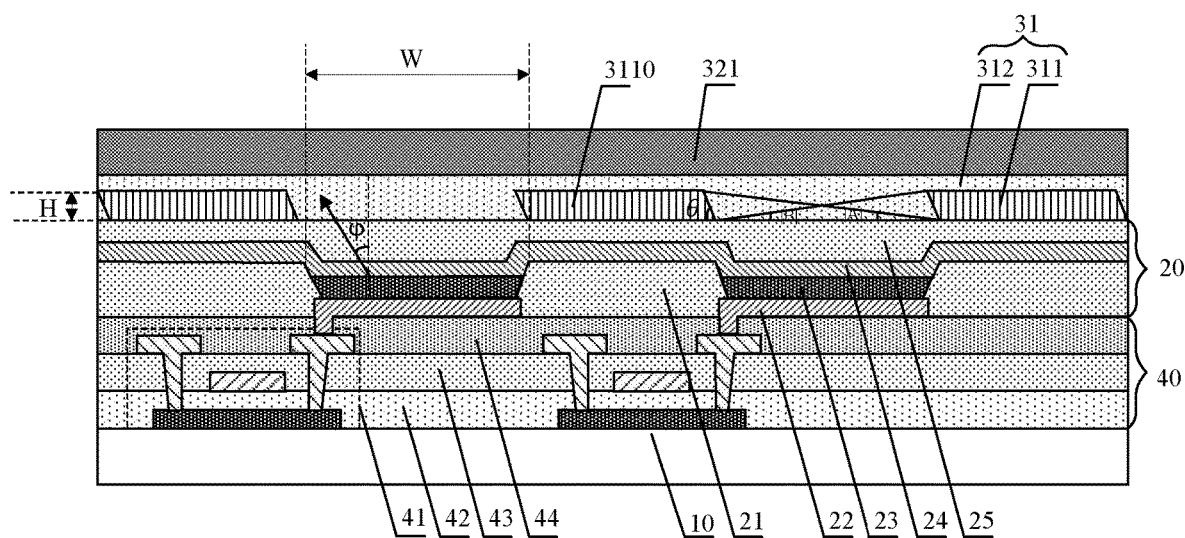
FIG. 4 is a cross-sectional view of a display panel according to an exemplary embodiment along a first direction.
Figure 5:
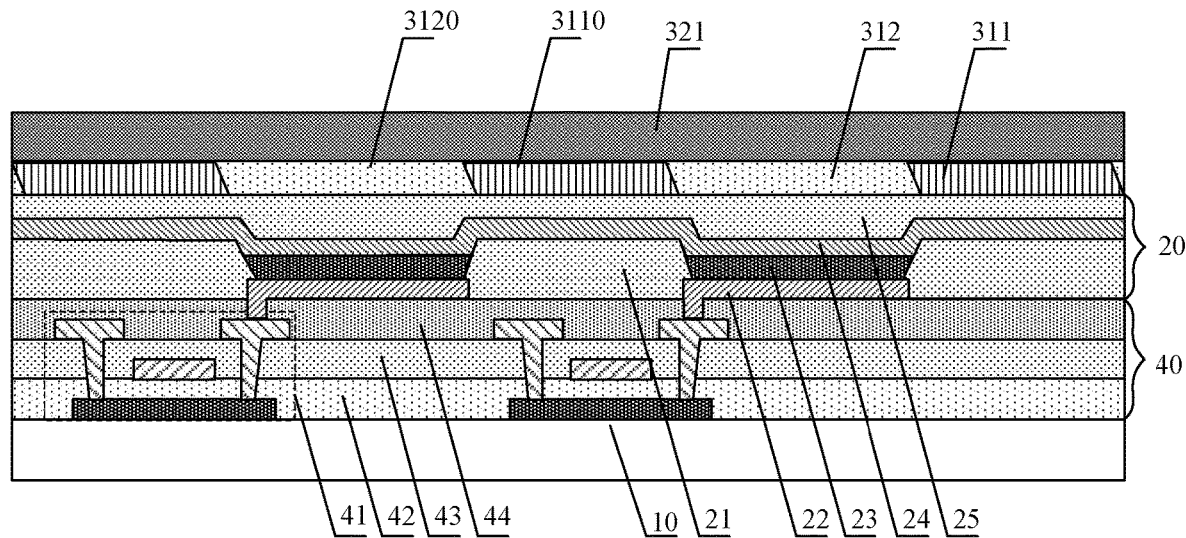
FIG. 5 is a cross-sectional view of a display panel according to another exemplary embodiment along a first direction.
Figure 6:
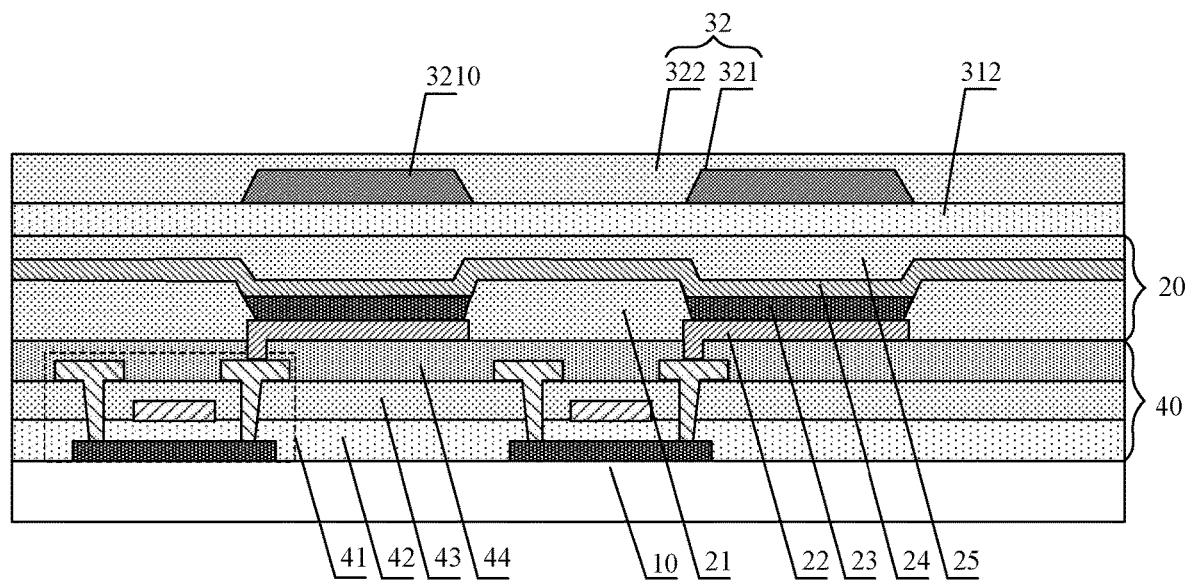
FIG. 6 is a cross-sectional view of a display panel according to an exemplary embodiment along a second direction.
Figure 7:
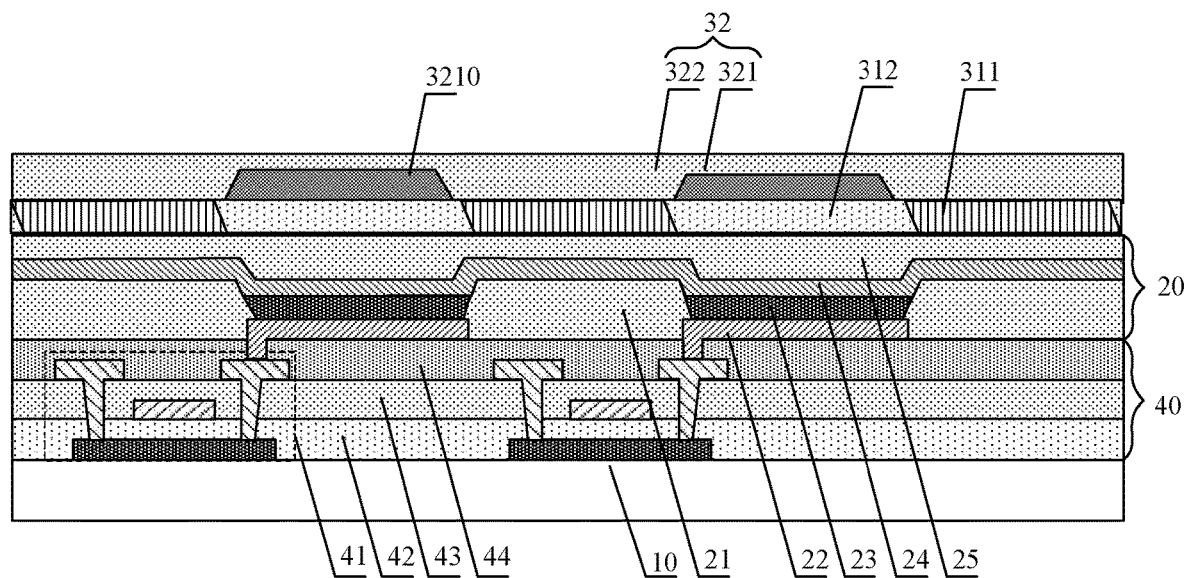
FIG. 7 is a schematic diagram of a structure of a display panel according to an exemplary embodiment.
Figure 8:
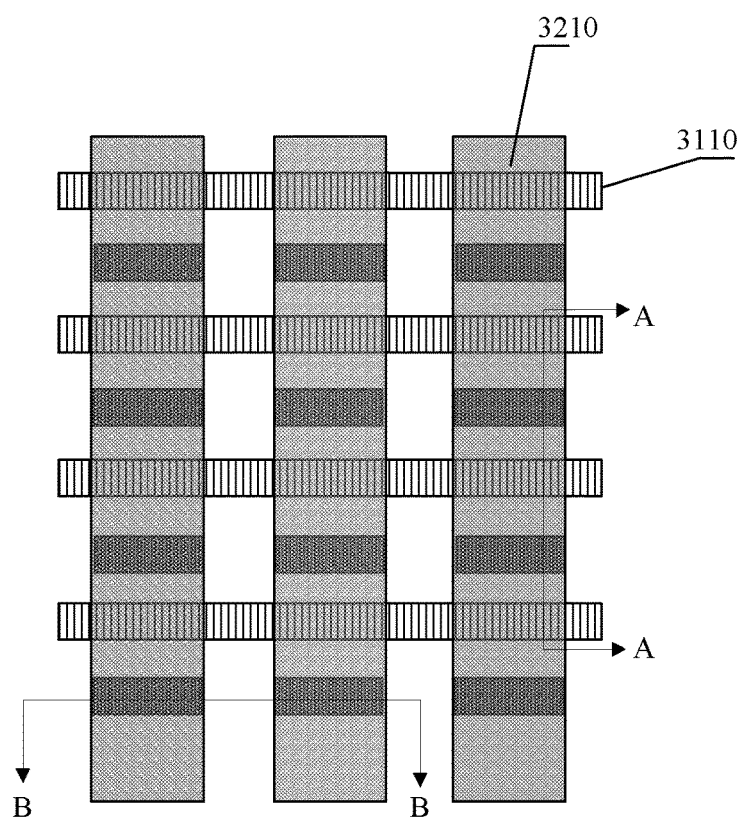
FIG. 8 is a top view of a display panel according to an exemplary embodiment.

FIG. 4 is a cross-sectional view of a display panel according to an exemplary embodiment along a first direction. FIG. 5 is a cross-sectional view of a display panel according to another exemplary embodiment along a first direction. FIG. 6 is a cross-sectional view of a display panel according to another exemplary embodiment along a first direction. FIG. 7 is a schematic diagram of a display panel according to an exemplary embodiment. FIG. 8 is a top view of a display panel according to an exemplary embodiment. FIGS. 4 and 5 are cross-sectional views of the display panel illustrated in FIG. 8 along A-A direction. FIG. 6 is a cross-sectional view of the display panel illustrated in FIG. 8 along B-B direction. As shown in FIGS. 4 to 8, in an exemplary embodiment, the first viewing angle improving layer includes an absorption layer 311 and a light transmission layer 312 which are disposed in the same layer.

The absorption layer 311 is configured to absorb light rays with an incident angle φ larger than a threshold angle. The light transmission layer 312 is configured to transmit light rays with an incident angle φ smaller than or equal to a threshold angle.

An orthographic projection of the pixel define layer 21 on the substrate 10 covers an orthographic projection of the absorption layer 311 on the substrate 10.

In an exemplary embodiment, transmittance of the light transmitting layer 312 is greater than 90%. A light transmission layer of a transmittance higher than 90% can improve display brightness and display effect of the display panel.

In an exemplary embodiment, the threshold angle is determined according to the first viewing angle range.

In an exemplary embodiment, a height of the absorption layer 311 is 70 microns to 150 microns. The height refers to a length of the absorption layer in a direction perpendicular to the display panel.

In an exemplary embodiment, a height of the light transmission layer 312 is greater than or equal to the height of the absorption layer. FIG. 4 illustrates the first viewing angle improving layer taking an example where the height of the light transmission layer 312 is greater than the height of the absorption layer 311. FIG. 5 illustrates the first viewing angle improving layer taking an example where the height of the light transmission layer 312 is equal to the height of the absorption layer 311.

In an exemplary embodiment, material of which the absorption layer 311 is made includes black ink.

In an exemplary embodiment, material of which the light transmission layer 312 is made includes polyethylene terephthalate or cyclic olefin polymer.

As shown in FIGS. 4, 5, 7 and 8, in an exemplary embodiment, the absorption layer 311 includes a plurality of absorption structures 3110 arranged along the first direction, wherein each absorption structure 3110 has a strip structure extending along the first direction.

A section of each absorption structure 3110 extending along the first direction and perpendicular to the substrate is a parallelogram, and an included angle θ between the hypotenuse and the bottom of the parallelogram satisfies the following formula:

$$\tan|A| = \frac{H}{W + H/\tan\theta}$$

-continued
$$\tan|B| = \frac{H}{W - H/\tan\theta}$$

In the formula, a range from A to B is the first viewing angle range; H is a height of the absorption structure; and W is a width of the organic light emitting layer along the second direction.

In an exemplary embodiment, the width of the organic light emitting layer 23 in the second direction may be 50 microns.

In an exemplary embodiment, a section of each absorption structure in the absorption layer extending along the first direction and perpendicular to the substrate is a parallelogram, which ensures that the viewing angle of the display panel along the first direction to satisfy the first viewing angle range and realizes the asymmetry of the viewing angle of the display panel in the first direction.

In an exemplary embodiment, as shown in FIG. 4, when the height of the light transmission layer 312 is greater than the height of the absorption layer 311, the light transmission layer 312 has a planar structure and an orthographic projection of the light transmission layer 312 on the substrate 10 covers an orthographic projection of the absorption layer 311 on the substrate.

In an exemplary embodiment, as shown in FIG. 5, when the height of the light transmission layer 312 is equal to the height of the absorption layer 311, the light transmission layer 312 includes a plurality of transmissive structures 3120 arranged along the first direction, wherein each of the transmission structures 3120 has a strip-shaped structure extending along the second direction.

The plurality of transmission structure 3120 correspond to the plurality of light emitting structures on a one-on-one basis and each transmission structure 3120 is configured to transmit light emitted from the corresponding light emitting structure. The plurality of transmission structures 3120 and the plurality of absorption structures 3110 are arranged alternately and the transmission structures 3120 are contiguous to the absorption structures 3110 on both sides.

In an exemplary embodiment, as shown in FIGS. 4 to 8, the second viewing angle improving layer 32 includes a diffusion layer 321 and a planarization layer 322. The planarization layer 322 is disposed on one side of the diffusion layer 321 away from the substrate 10.

The diffusion layer 321 is configured to diffuse light emitted from the light emitting structure layer 20, and a refractive index of the diffusion layer 321 is greater than a refractive index of the planarization layer 322. An orthographic projection of the planarization layer 322 on the substrate 10 covers an orthographic projection of the diffusion layer 321 on the substrate 10.

In an exemplary embodiment, transmittance of the planarization layer 322 is greater than 90%.

In an exemplary embodiment, as shown in FIG. 6, the diffusion layer 321 includes a plurality of diffusion structures 3210 arranged along the second direction, wherein each of the diffusion structures 3210 has a strip-shaped structure extending along the second direction.

An orthographic projection of the diffusion structure 3210 on the substrate 10 covers an orthographic projection of the organic light emitting layer included in the corresponding light emitting structure on the substrate 10.

In an exemplary embodiment, a cross section of the diffusion structure 3210 extending along the second direction and perpendicular to the substrate is an isosceles trapezoid. An included angle between a leg and a bottom base of the isosceles trapezoid is greater than or equal to 20 degrees and less than or equal to 50 degrees.

An included angle between a leg and a bottom base of the isosceles trapezoid may be equal to 30 degrees.

In an exemplary embodiment, the diffusion layer 321 is made of a transparent organic material doped with nitrogen atoms or phosphorus atoms. The transparent organic material may include acrylic resin, unsaturated polyester, polyurethane or epoxy resin.

In an exemplary embodiment, the refractive index of the diffusion layer 321 is 1.6 to 1.7.

In an exemplary embodiment, a height of the diffusion layer 321 is 50 microns to 100 microns.

In an exemplary embodiment, material of which the planarization layer 322 is made is a transparent organic material. The transparent organic material may include acrylic resin, unsaturated polyester, polyurethane or epoxy resin.

In an exemplary embodiment, a refractive index of the planarization layer 322 is 1.5 to 1.6.

In an exemplary embodiment, a height of the planarization layer 322 is greater than the height of the diffusion layer.

In an exemplary embodiment, when the light emitted from the light emitting structure layer enters the diffusion layer and is emitted to the planarization layer, the previous light path will be changed, and the viewing angle of the display panel in the second direction can be effectively switched to the second viewing angle range, i.e. the symmetrical wide viewing angle.

In an exemplary embodiment, the absorption layer in the first viewing angle improving layer and the diffusion layer in the second viewing angle improving layer are distributed in the pixel define layer and the light emitting structure layer at intervals. The light transmission layer in the first viewing angle improving layer and the planarization layer in the second viewing angle improving layer are both transmission regions and thus, the first viewing angle achieved by the first viewing angle improving layer can be superimposed with the second viewing angle achieved by the second viewing angle improving layer without mutual influence.

Figure 9:
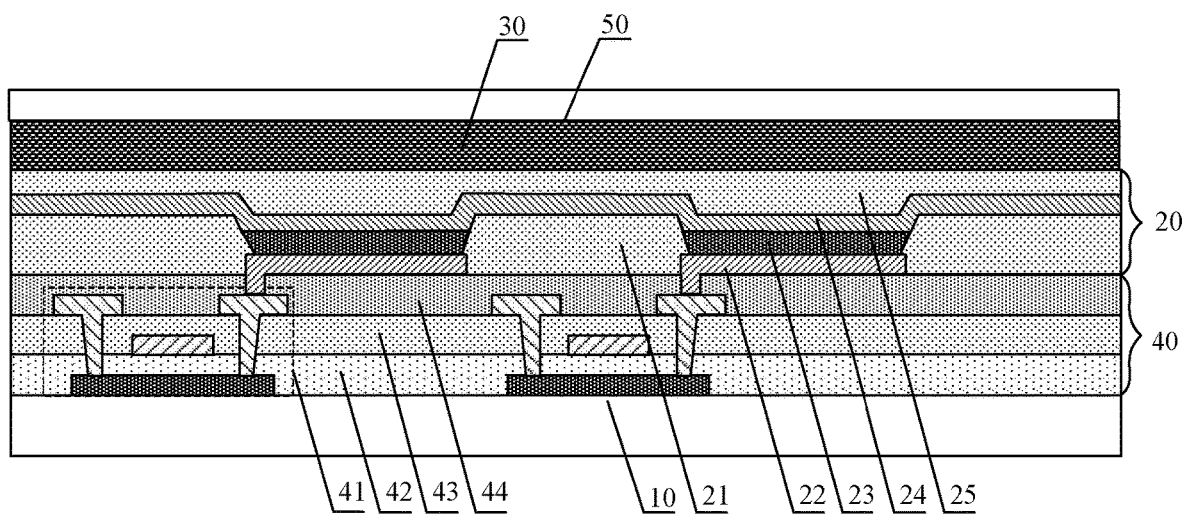
FIG. 9 is a schematic diagram of a structure of a display panel according to an exemplary embodiment.

FIG. 9 is a schematic diagram of a structure of a display panel according to an exemplary embodiment. As shown in FIG. 9, the display panel according to an exemplary embodiment may further include a protection layer 50.

In an exemplary embodiment, the protection layer may be a transparent protection layer.

In an exemplary embodiment, the protection layer is disposed on one side of the viewing angle improving layer away from the substrate 10.

In an exemplary embodiment, the protection layer may be made of an organic material or an inorganic material. The organic material may include polyethylene terephthalate. The inorganic materials may include glass.

Figure 10:
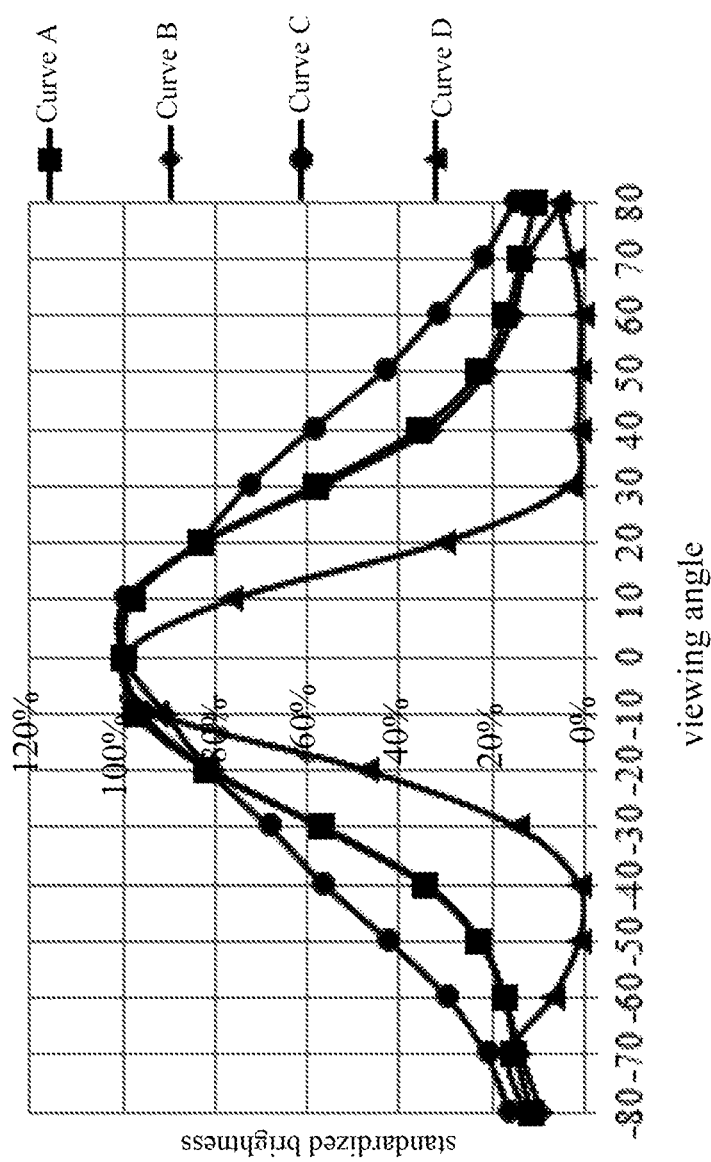
FIG. 10 is a curve graph of a simulated viewing angle brightness attenuation of a display panel before and after a viewing angle improving layer is provided.

FIG. 10 is a curve graph of the simulated viewing angle brightness attenuation of a display panel before and after a viewing angle improving layer is provided. FIG. 10 illustrates a simulation taking an example where the thickness of the absorption layer in the first viewing angle improving layer is 70 microns and an included angle between the hypotenuse and the bottom base of the cross section of the absorption structure is 82.48 degrees, with the cross section extending along the first direction and perpendicular to the substrate while a thickness of the diffusion layer in the second viewing angle improving layer is 50 microns, the included angle between the leg and the bottom base of the cross section of the diffusion layer is 30 degrees, with the cross section extending along the second direction and perpendicular to the substrate, and the transmittance of both the light transmission layer and the planarization layer is 90%. In FIG. 10, Curve A represents the curve of the viewing angle brightness attenuation in the second direction before a viewing angle improving layer is provided; Curve B represents the curve of the viewing angle brightness attenuation in the first direction before a viewing angle improving layer is provided; Curve C represents the curve of the viewing angle brightness attenuation in the second direction after a second viewing angle improving layer is provided; Curve D represents the curve of the viewing angle brightness attenuation in the second direction after a first viewing angle improving layer is provided. As shown in FIG. 10, before the viewing angle improving layer is provided, the brightness curves in the first direction and the second direction are substantially the same, which cannot meet the requirements on viewing angle of the vehicle mounted display panel. After the first viewing angle improving layer is provided, a positive brightness cut-off of 40 degrees and a negative brightness cut-off of 30 degrees are obtained in the first direction of the display panel and thus, an asymmetric viewing angle in the first direction is obtained. After the second viewing angle improving layer is provided, the brightness attenuation ratio in the second direction increases from the initial 30% to 60% at a brightness of 40 and thus, a brightness increase in the second direction is obtained. Arrangement of the viewing angle improving layer can meet the requirements on viewing angle of the vehicle mounted display panel.

An embodiment of the disclosure further provides a vehicle mounted display including a display panel arranged in a vehicle.

The display panel is the display panel according to any one of the previous embodiments with similar implementation principles and effects, which will not be described further here.

Figure 11:
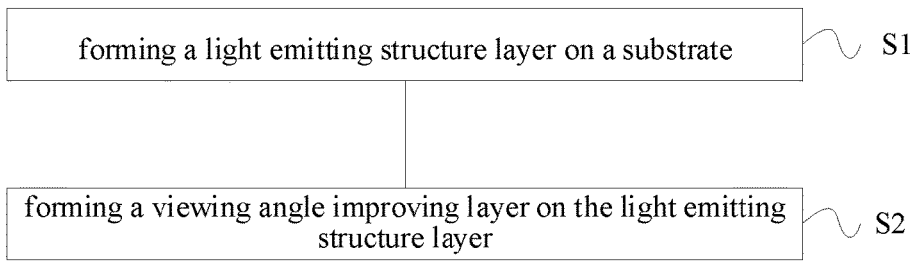
FIG. 11 is a flowchart of a method for manufacturing a display panel according to an embodiment of the present disclosure.

An embodiment of the present disclosure further provide a method for manufacturing a display panel, which is configured to manufacture the display panel according to any of the previous embodiments. FIG. 11 is a flowchart of the method for manufacturing a display panel according to an embodiment of the present disclosure. As shown in FIG. 11, the method for manufacturing a touch display substrate according to an embodiment of the present disclosure includes the following steps:

Step S1: forming a light emitting structure layer on a substrate.

In an exemplary embodiment, the light emitting structure layer is configured to emit light to a viewing angle improving layer.

Step S1 includes forming a driving structure layer on the substrate and forming the light emitting structure layer on the driving structure layer.

Forming the driving structure layer on the substrate may include forming an active layer of a transistor on the substrate, forming a first insulating layer on the substrate where the active layer of a transistor is formed, forming a gate electrode of the transistor on the first insulating layer, forming a second insulating layer on the substrate where the gate electrode of the transistor is formed, forming source and drain electrodes on the second insulating layer, and forming a third insulating layer on the substrate where the source and the drain electrodes are formed.

Forming the light emitting structure layer on the driving structure layer includes forming a first electrode on the driving structure layer, forming a pixel define layer on the substrate where the first electrode is formed, forming an organic light emitting layer on the substrate where the pixel define layer is formed, forming a second electrode on the substrate where the organic light emitting layer is formed, and forming an encapsulation layer.

Step S2, forming a viewing angle improving layer on the light emitting structure layer.

In an exemplary embodiment, the viewing angle improving layer is configured to adjust the viewing angle of the display panel to allow the viewing angle of the display panel along a first direction satisfies a first viewing angle range and the viewing angle along a second direction satisfies a second viewing angle range.

In an exemplary embodiment, the first direction is perpendicular to the second direction, which means that an included angle between the first direction and the second direction is about 90 degrees.

The display panel is the display panel according to any one of the previous embodiments with similar implementation principles and effects, which will not be described further here.

In an exemplary embodiment, the viewing angle improving layer includes a first viewing angle improving layer and a second viewing angle improving layer. Step S2 includes forming the first viewing angle improving layer on the light emitting structure layer and forming the second viewing angle improving layer on the first viewing angle improving layer or includes forming the second viewing angle improving layer on the light emitting structure layer and forming the first viewing angle improving layer on the second viewing angle improving layer.

In an exemplary embodiment, forming the first viewing angle improving layer on the light emitting structure layer includes forming an absorption layer on the light emitting structure layer by a patterning process and forming a light transmission layer on the absorption layer by a patterning process.

In an exemplary embodiment, the "patterning process" includes processes of film layer deposition, photoresist coating, mask exposure, development, etching, and photoresist stripping. Deposition may be implemented by any one or more of sputtering, evaporation, and chemical vapor deposition, coating may be implemented by any one or more of spraying and spin coating, and etching may be implemented by any one or more of dry etching and wet etching. "Thin film" refers to a layer of thin film manufactured from a certain material on a substrate by using deposition or coating process. If it does not need a patterning process throughout the whole manufacturing process, the thin film may also be referred to as a "layer". If it needs a patterning process during the whole manufacturing process, the thin film is referred to as a "thin film" before the patterning process.

In an exemplary embodiment, forming the second viewing angle improving layer on the first viewing angle improving layer includes forming a diffusion layer on the first viewing angle improving layer by a printing process or by a patterning process and forming a planarization layer on the diffusion layer by a patterning process.

In an exemplary embodiment, forming the second viewing angle improving layer on the light emitting structure layer includes forming a diffusion layer on the light emitting structure layer by a printing process or by a patterning process and forming a planarization layer on the diffusion layer by a patterning process.

In an exemplary embodiment, forming the first viewing angle improving layer on the second viewing angle improving layer includes forming an absorption layer on the second viewing angle improving layer by a patterning process and forming a light transmission layer on the absorption layer by a patterning process.

In an exemplary embodiment, after step S2, the method for manufacturing the display panel further includes forming a protection layer on the viewing angle improving layer.

A structure of a display panel according to an exemplary embodiment is described with reference to FIGS. 12 to 18 and with an example of the manufacturing process of forming a first viewing angle improving layer on a light emitting structure layer and forming a second viewing angle improving layer on the first viewing angle improving layer.

Figure 12:
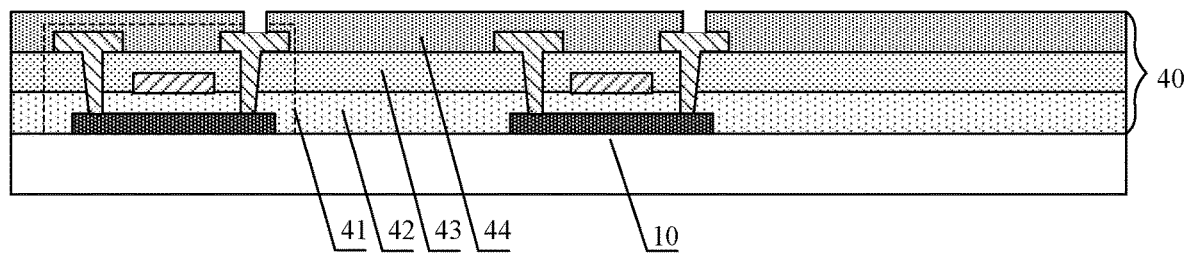
FIG. 12 is a schematic diagram after a driving structure layer is formed.

(1) Forming a driving structure layer 40 on a substrate 10, which includes depositing a semiconductor thin film on the substrate 10, patterning the semiconductor thin film by a patterning process to form an active layer of a transistor 41, depositing a first insulating thin film on the substrate 10 where the active layer of the transistor 41 is formed, patterning the first insulating thin film by a patterning process to form a first insulating layer 42, depositing a first metal thin film on the first insulating layer 42, patterning the first metal thin film by a patterning process to form a gate electrode of transistor 41, depositing a second insulating film on the substrate 10 where the gate electrode of transistor 41 is formed, patterning the second insulating thin film to form a second insulating layer 43, depositing a second metal thin film on the second insulating layer 43, patterning the second metal thin film by a patterning process to form source and drain electrodes, depositing a third insulating thin film on substrate 10 where source and drain electrodes are formed, patterning the third metal file by a patterning process to form a third insulating layer 44, as shown in FIG. 12.

Figure 13:
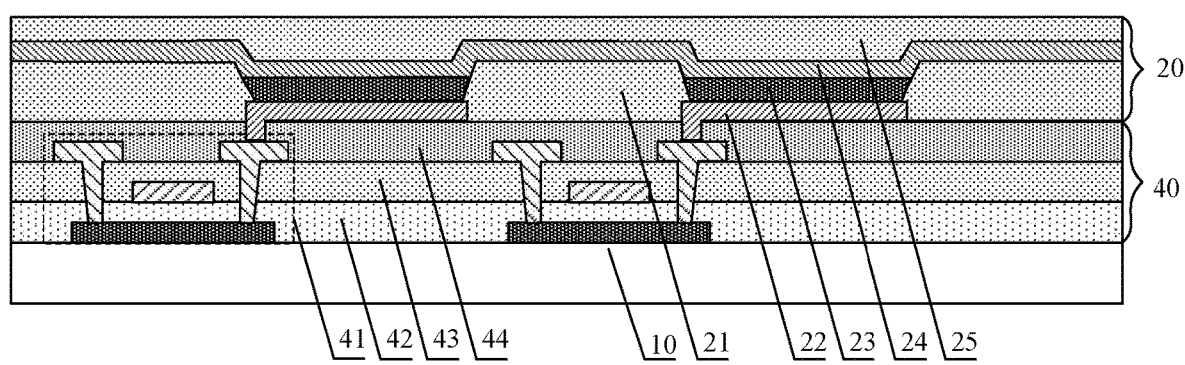
FIG. 13 is a schematic diagram after a light emitting structure layer is formed.

(2) Forming a light emitting structure layer 20, which includes depositing a third metal thin film on a driving structure layer 40, patterning the third metal thin film to form the first electrode 22, coating a pixel define thin film on the substrate 10 where the first electrode 22 is formed, forming a pixel define layer 21 through mask, exposure and development processes, forming an organic light emitting layer 23 on the substrate 10 where the pixel define layer 21 is formed, depositing a transparent conductive thin film on the substrate 10 where the organic light emitting layer 23 is formed, and patterning the transparent conductive thin film by a patterning process to form a second electrode 24 and forming an encapsulation layer 25 on the substrate 10 where the second electrode 24 is formed, as shown in FIG. 13.

Figure 14:
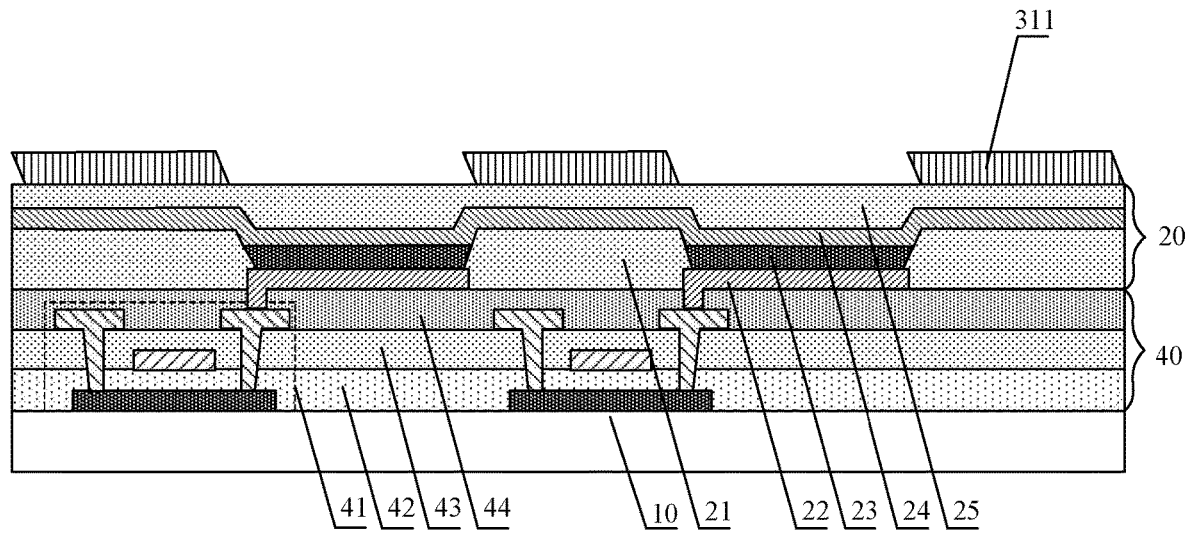
FIG. 14 is a schematic diagram after an absorption layer is formed.

(3) Forming an absorption layer 311 on the light emitting structure layer 20, which includes coating an absorption thin film on the light emitting structure layer 20 and forming the absorption layer 311 by masking, exposure and development processes, as shown in FIG. 14.

Figure 15:
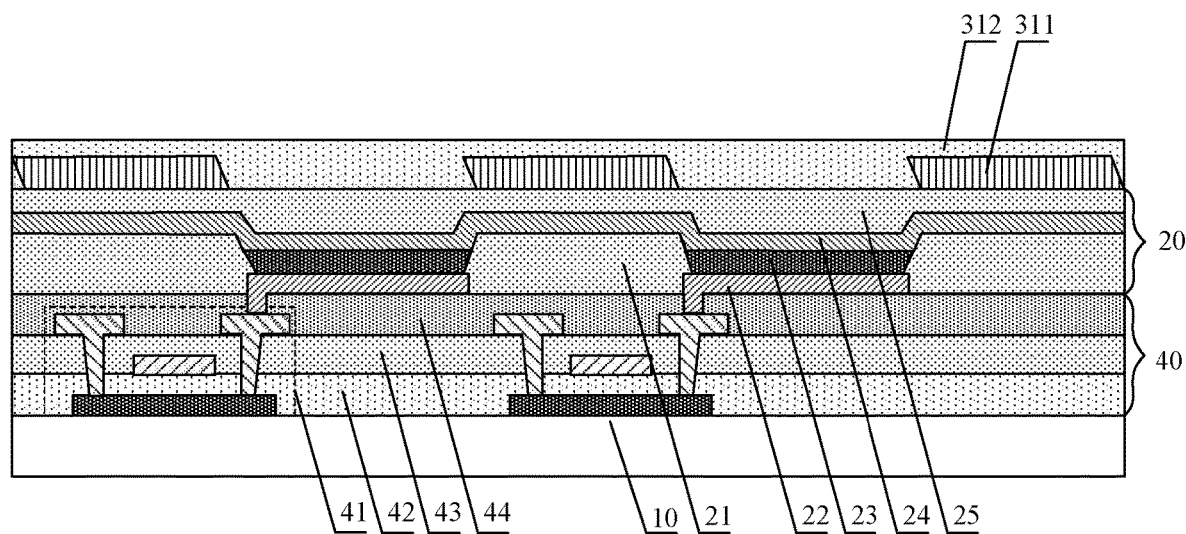
FIG. 15 is a schematic diagram after a light transmission layer is formed.

(4) Forming a light transmission layer 312 on the substrate 10 where the absorption layer 311 is formed, which includes coating a transmission thin film on the substrate where the absorption layer 311 is formed, and forming the light transmission layer 312 through masking, exposure and development processes, as shown in FIG. 15, FIG. 15 shows an example where the height of the light transmission layer is greater than the absorption layer.

Figure 16:
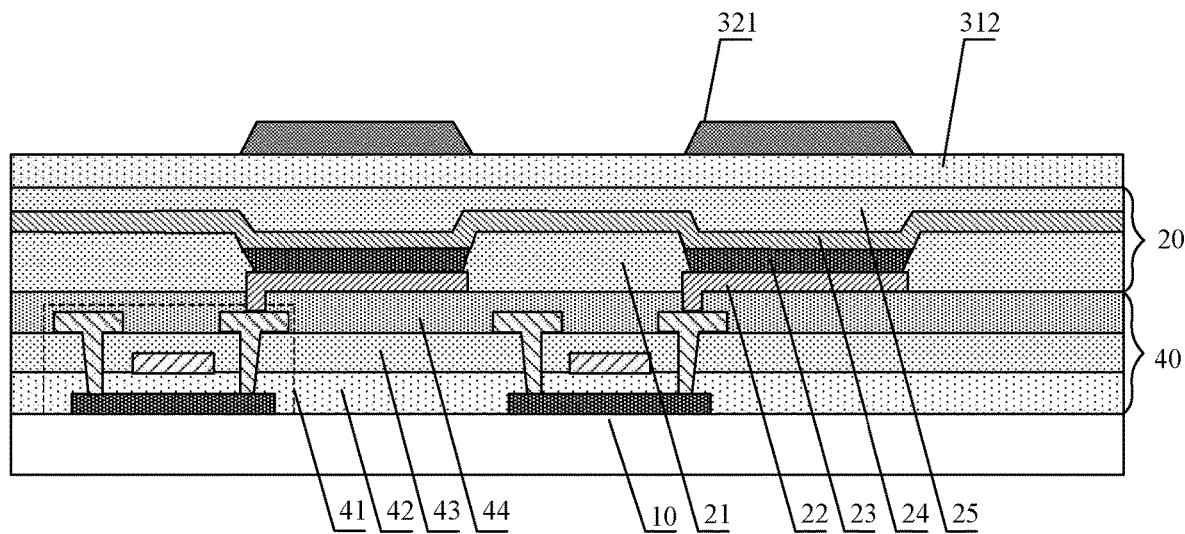
FIG. 16 is a schematic diagram after a diffusion layer is formed.

(5) Forming a diffusion layer 321 on the substrate 10 where the light transmission layer 312 is formed, which includes forming the diffusion layer 321 on the substrate 10 where the light-transmitting layer 312 is formed by a printing process or by coating a diffusion thin film on the substrate 10 where the light transmission layer 312 is formed by masking, exposure and development processes, as shown in FIG. 16.

FIGS. 15 and 16 are cross sections of the display panel along different directions. FIG. 15 is a cross section of the display panel along the first direction and FIG. 16 is a cross section of the display panel along the second direction.

Figure 17:
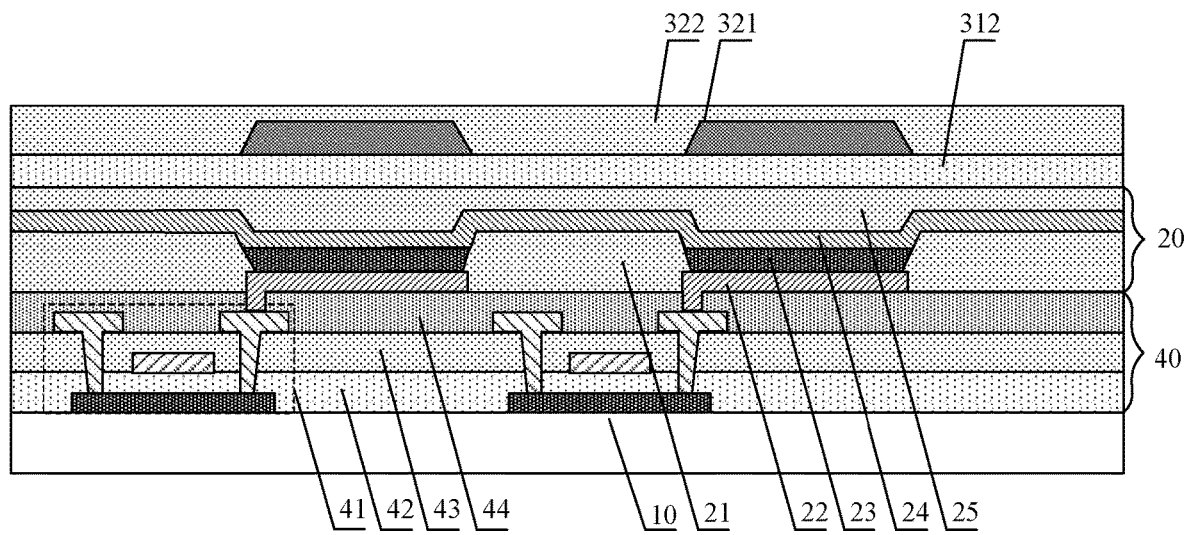
FIG. 17 is a schematic diagram after a planarization layer is formed.

(6) Forming a planarization layer 322 on the substrate 10 where the diffusion layer 321 is formed, which includes coating a planarization thin film on the substrate 10 where the diffusion layer 321 is formed and forming the planarization layer 322 by mask, exposure and development processes, as shown in FIG. 17.

Figure 18:
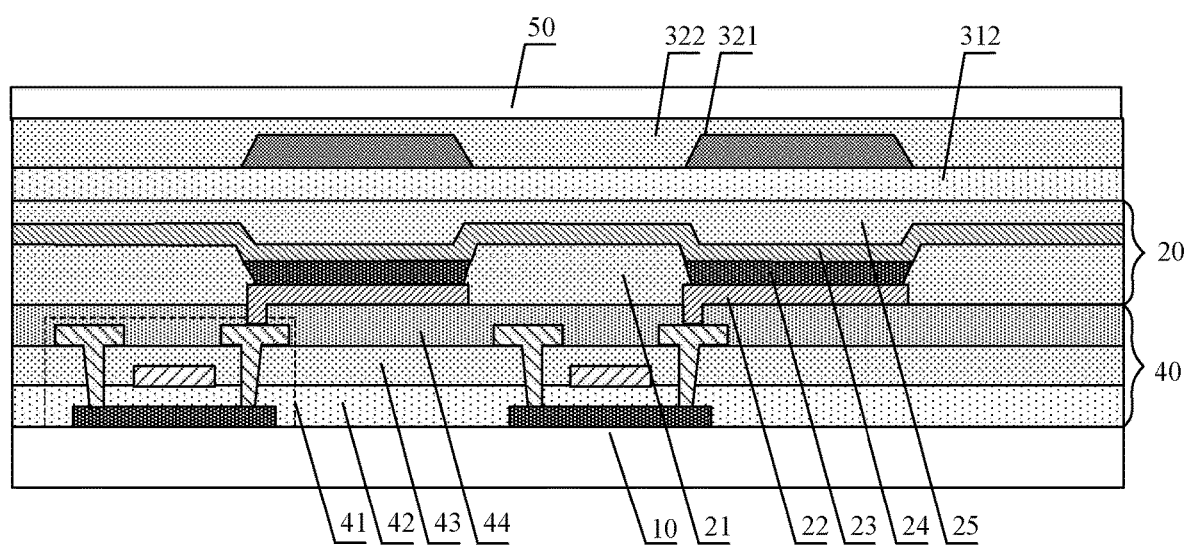
FIG. 18 is a schematic diagram after a protection layer is formed.

(7) Forming a protection layer 50 on the planarization layer 322, as shown in FIG. 18.

The drawings in the present disclosure only involve the structures included in the embodiments of the present disclosure, and other structures may be obtained with reference to common designs.

For the sake of clarity, the thickness and size of layers or microstructures are exaggerated in the drawings used to describe the embodiments of the present disclosure. It may be understood that when the element is referred to as being "on" or "under" another element, an element such as a layer, a film, a region or a substrate may be "directly" "on" or "under" the another element, or there may be other elements in between.

Although implementations disclosed in the present disclosure are as the above, the described contents are only implementations used for facilitating understanding the present disclosure, and are not used to limit the present disclosure. Any person skilled in the art to which the present disclosure pertains may make any modifications and variations in the form and details of implementation without departing from the spirit and the scope of the present disclosure, but the patent protection scope of the present disclosure shall still be subject to the scope defined in the appended claims.

What is claimed is:

1. An OLED display panel, comprising:
a substrate, a light emitting structure layer and a viewing angle improving layer which are disposed on the substrate,
wherein:
the light emitting structure layer is configured to emit light to the viewing angle improving layer;
the viewing angle improving layer is disposed on one side of the light emitting structure layer away from the substrate and is configured to adjust viewing angles of the display panel to allow a viewing angle of the display panel along a first direction to satisfy a first viewing angle range and to allow a viewing angle along a second direction to satisfy a second viewing angle range, and the first viewing angle range is smaller than the second viewing angle range;
the first direction is perpendicular to the second direction;
the viewing angle improving layer comprises: a first viewing angle improving layer and a second viewing angle improving layer;
the first viewing angle improving layer is disposed on one side of the second viewing angle improving layer close to the substrate or the first viewing angle improving layer is disposed on one side of the second viewing angle improving layer away from the substrate;
the first viewing angle improving layer is configured to adjust the viewing angle of the display panel along the first direction to allow the viewing angle of the display panel along the first direction to satisfy the first viewing angle range;
the second viewing angle improving layer is configured to adjust the viewing angle of the display panel along the second direction to allow the viewing angle of the display panel along the second direction to satisfy the second viewing angle range;
the light emitting structure layer comprises: a pixel define layer, a plurality of light emitting structures and an encapsulation layer;
each light emitting structure comprises: a first electrode, an organic light emitting layer and a second electrode, the first electrode is disposed on a side of the organic light emitting layer close to the substrate and the second electrode is disposed on a side of the organic light emitting layer away from the substrate;
the pixel define layer is provided with a plurality of opening regions, each of the opening regions forms an effective light emitting region corresponding to the light emitting structure, and second electrodes of adjacent light emitting structures are electrically connected with each other;
the encapsulation layer is disposed on one side of the second electrodes away from the substrate;
the second viewing angle improving layer comprises: a diffusion layer and a planarization layer, the planarization layer is disposed on one side of the diffusion layer away from the substrate;
the diffusion layer is configured to diffuse light emitted from the light emitting structure layer, and a refractive index of the diffusion layer is larger than a refractive index of the planarization layer;
an orthographic projection of the planarization layer on the substrate covers an orthographic projection of the diffusion layer on the substrate, and a transmittance of the planarization layer is greater than 90%;
the diffusion layer comprises: a plurality of diffusion structures arranged along the second direction, and the diffusion structures have strip structures extending along the first direction;
an orthographic projection of each diffusion structure on the substrate covers an orthographic projection of the organic light emitting layer included in the corresponding light emitting structure on the substrate; and
a cross section of each diffusion structure extending along the second direction and perpendicular to a plane of the substrate is an isosceles trapezoid, an included angle between a leg and a bottom base of the isosceles trapezoid is greater than or equal to 20 degrees and less than or equal to 50 degrees.

2. The display panel according to claim 1, wherein the first viewing angle improving layer comprises: an absorption layer and a light transmission layer which are arranged on a same layer,
wherein the absorption layer is configured to absorb light rays with an incident angle larger than a threshold angle;
the light transmission layer is configured to transmit light rays with an incident angle smaller than or equal to the threshold angle; and
an orthographic projection of a non-opening region of the pixel define layer on the substrate covers an orthographic projection of the absorption layer on the substrate, and a transmittance of the light transmission layer is greater than 90%.

3. The display panel according to claim 2, wherein in a direction perpendicular to the substrate, a height of the absorption layer is 70 microns to 150 microns and a height of the light transmission layer is greater than or equal to the height of the absorption layer;
 a material of which the absorption layer is made comprises black ink; and
 a material of which the light transmission layer is made comprises polyethylene terephthalate or cyclic olefin polymer.

4. The display panel according to claim 2, wherein the absorption layer comprises: a plurality of absorption structures arranged along the first direction, the absorption structures have strip structures with a size in the second direction being larger than a size in the first direction;
 wherein a cross section of each absorption structure extending along the first direction and perpendicular to a plane of the substrate is a parallelogram, and an included angle θ between a side parallel to and closer to the substrate and an adjacent side thereof of the parallelogram satisfies following formula:

$$\tan|A| = \frac{H}{W + H/\tan\theta}$$

$$\tan|B| = \frac{H}{W - H/\tan\theta}$$

wherein a range from A to B is the first viewing angle range, H is a height of the absorption structure and W is a width of an opening region along the second direction.

5. The display panel according to claim 4, wherein in a case that a height of the light transmission layer is greater than a height of the absorption layer, the light transmission layer has a planar structure and an orthographic projection of the light transmission layer on the substrate covers the orthographic projection of the absorption layer on the substrate.

6. The display panel according to claim 4, wherein in a case that a height of the light transmission layer is equal to a height of the absorption layer, the light transmission layer comprises: a plurality of transmission structures arranged along the first direction, and a size of each of the transmission structures in the second direction is larger than a size of each of the transmission structures in the first direction;
 wherein orthographic projections of the transmission structures on the substrate are overlapped with orthographic projections of the plurality of opening regions on the substrate, and the transmission structures are configured to transmit light emitted by the corresponding light emitting structures; and
 the plurality of transmission structures and the plurality of absorption structures are arranged alternately and the transmission structures are contiguous to the absorption structures on both sides.

7. The display panel according to claim 2, wherein the second viewing angle improving layer comprises: a diffusion layer and a planarization layer, the planarization layer is disposed on a side of the diffusion layer away from the substrate,
 wherein the diffusion layer is configured to diffuse light emitted from the light emitting structure layer, a refractive index of the diffusion layer being larger than a refractive index of the planarization layer;
 an orthographic projection of the planarization layer on the substrate covers an orthographic projection of the diffusion layer on the substrate, and a transmittance of the planarization layer is greater than 90%.

8. The display panel according to claim 1,
 wherein a material of which the diffusion layer is made is a transparent organic material doped with nitrogen atoms or phosphorus atoms, a refractive index of the diffusion layer is 1.6 to 1.7, and a height of the diffusion layer is 50 microns to 100 microns; and
 a material of which the planarization layer is made is a transparent organic material, a refractive index of the planarization layer is 1.5 to 1.6 and a height of the planarization layer is greater than the height of the diffusion layer;
 wherein the transparent organic material comprises at least one of: acrylic resin, unsaturated polyester, polyurethane and epoxy resin.

9. The display panel according to claim 1, wherein the display panel further comprises: a protection layer,
 wherein the protection layer is disposed on one side of the viewing angle improving layer away from the substrate, a material of the protection layer comprises at least one of: polyethylene terephthalate and glass.

10. The display panel according to claim 1, wherein the first viewing angle range is an asymmetric viewing angle range and the second viewing angle range is a symmetric viewing angle range.

11. A display apparatus, comprising the display panel according to claim 1 which is arranged in a vehicle.

12. A method for manufacturing a display panel, which is configured to manufacture the display panel according to claim 1, comprising:
 forming the light emitting structure layer on the substrate, wherein the light emitting structure layer is configured to emit light to the viewing angle improving layer; and
 forming the viewing angle improving layer on the light emitting structure layer, wherein the viewing angle improving layer is configured to adjust the viewing angles of the display panel to allow the viewing angle of the display panel along the first direction to satisfy the first viewing angle range and allow the viewing angle along the second direction to satisfy the second viewing angle range, and the first viewing angle range is smaller than the second viewing angle range,
 wherein the first direction is perpendicular to the second direction.

13. The method according to claim 12, wherein the viewing angle improving layer comprises a first viewing angle improving layer and a second viewing angle improving layer,
 forming the viewing angle improving layer on the light emitting structure layer comprises:
 forming the first viewing angle improving layer on the light emitting structure layer; and
 forming the second viewing angle improving layer on the first viewing angle improving layer,
 or
 forming the viewing angle improving layer on the light emitting structure layer comprises:
 forming the second viewing angle improving layer on the light emitting structure layer; and
 forming the first viewing angle improving layer on the second viewing angle improving layer.

14. The method according to claim 13,
 wherein forming the first viewing angle improving layer on the light emitting structure layer comprises: forming an absorption layer on the light emitting structure layer by a patterning process; and forming a light transmission layer on the absorption layer by a patterning process; and forming the second viewing angle improving layer on the first viewing angle improving layer comprises: forming a diffusion layer on the first viewing angle improving layer by a printing process or a patterning process; and forming a planarization layer on the diffusion layer by a patterning process.

15. The method according to claim 13, wherein forming the second viewing angle improving layer on the light emitting structure layer comprises: forming a diffusion layer on the light emitting structure layer by a printing process or a patterning process; and forming a planarization layer on the diffusion layer through a patterning process; and forming the first viewing angle improving layer on the second viewing angle improving layer comprises: forming an absorption layer on the second viewing angle improving layer by a patterning process; and forming a light transmission layer on the absorption layer by a patterning process.

16. The method according to claim 12, further comprising:

forming a protection layer on the viewing angle improving layer.

* * * * *